United States Patent
Nemoz et al.

(10) Patent No.: US 7,859,837 B2
(45) Date of Patent: Dec. 28, 2010

(54) MODULAR ELECTRONIC DEVICE OPERATING IN DIFFICULT ENVIRONMENTS

(75) Inventors: Gerard Nemoz, Maisons-Alfort (FR); Olivier Leborgne, Garancieres (FR); Serge Bernadac, Bagneux (FR)

(73) Assignee: Thales (FR)

( * ) Notice: Subject to any disclaimer, the term of this patent is extended or adjusted under 35 U.S.C. 154(b) by 264 days.

(21) Appl. No.: 11/915,372

(22) PCT Filed: Apr. 24, 2006

(86) PCT No.: PCT/EP2006/061780

§ 371 (c)(1),
(2), (4) Date: Jun. 10, 2008

(87) PCT Pub. No.: WO2006/125704

PCT Pub. Date: Nov. 30, 2006

(65) Prior Publication Data

US 2009/0213543 A1    Aug. 27, 2009

(30) Foreign Application Priority Data

May 24, 2005   (FR) .................................. 05 05210

(51) Int. Cl.
*H05K 7/20*    (2006.01)
(52) U.S. Cl. ..................... 361/690; 361/695; 361/699; 361/700; 361/704; 361/719; 165/80.3; 62/259.2; 174/15.1
(58) Field of Classification Search ................ 361/689, 361/690, 695, 699, 700, 704, 719, 720, 752
See application file for complete search history.

(56) References Cited

U.S. PATENT DOCUMENTS

| 5,201,855 | A | 4/1993 | Ikola |
| 5,518,758 | A | 5/1996 | Tiburtius et al. |
| 6,084,774 | A | 7/2000 | Talbot et al. |
| 6,466,441 | B1 | 10/2002 | Suzuki |
| 6,588,497 | B1 * | 7/2003 | Glezer et al. .................. 165/84 |

(Continued)

FOREIGN PATENT DOCUMENTS

DE    29923011 U1    2/2000

(Continued)

OTHER PUBLICATIONS

Decision on Grant Patent for Invention of Russian Application No. 2007143050 mailed Mar. 3, 2010.

*Primary Examiner*—Jayprakash N Gandhi
*Assistant Examiner*—Courtney Smith
(74) *Attorney, Agent, or Firm*—Lowe Hauptman Ham & Berner, LLP

(57) ABSTRACT

The invention relates to an electronic device operating in difficult environments. The electronic device comprises at least one printed circuit board supporting heat-dissipating electronic components, a heat sink, a first side of which is in contact with electronic components on a first side of the printed circuit board, and a second side of which is designed to evacuate heat by convection, characterized in that it also comprises a cover delimiting a channel in which a coolant circulates to ensure convection, the cover being joined to the heat sink and the printed circuit board, and in that the channel prevents the coolant from coming into contact with the electronic components.

14 Claims, 6 Drawing Sheets

U.S. PATENT DOCUMENTS

| | | | |
|---|---|---|---|
| 6,765,796 B2 * | 7/2004 | Hoffman et al. | 361/695 |
| 7,104,078 B2 * | 9/2006 | Tilton | 62/121 |
| 7,307,851 B2 * | 12/2007 | Dimarco | 361/753 |
| 2003/0172669 A1 * | 9/2003 | Tilton et al. | 62/310 |
| 2006/0133033 A1 * | 6/2006 | Straub et al. | 361/690 |

FOREIGN PATENT DOCUMENTS

| | | |
|---|---|---|
| FR | 2826831 | 1/2003 |
| RU | 2152697 C1 | 7/2000 |
| SU | 1772897 A1 | 10/1992 |

* cited by examiner

MODULAR ELECTRONIC DEVICE OPERATING IN DIFFICULT ENVIRONMENTS

CROSS-REFERENCE TO RELATED APPLICATIONS

The present Application is based on International Application No. PCT/EP2006/061780, filed on Apr. 24, 2006 which in turn corresponds to France Application No. 05 05210, filed on May 24, 2005, and priority is hereby claimed under 35 USC §119 based on these applications. Each of these applications are hereby incorporated by reference in their entirety into the present application.

FIELD OF THE INVENTION

The invention relates to an electronic device operating in difficult environments.

The invention is of particular use in aeronautics and particularly on board small and non-pressurized aircraft, in particular helicopters, that do not benefit from a protected climatic environment guaranteed by their structure or by their air conditioning function. Such a protected climatic environment is necessary to the operation of the electronic equipment, for example the printed circuit boards, mounted on board aircraft. In practice, a forced movement of coolant, such as air for example, in proximity to electronic equipment is used to evacuate the heat that the electronic equipment dissipates. The life span of such electronic equipment is degraded if the circulating coolant carries impurities, corrosive impurities for example. It is therefore necessary to ensure a circulation of coolant in proximity to the electronic equipment while avoiding any direct contact between the fluid and the electronic equipment.

DESCRIPTION OF THE PRIOR ART

One solution to this problem is to make an electronic gear module in which printed circuit boards are fitted seal-tight to the coolant. One drawback presented by this solution stems from the fact that the evacuation from the module of the heat dissipated by the electronic components carried by the printed circuit boards is then not always sufficient or can even be achieved only at the cost of a significant increase in the weight of the module caused by the use of heat drains to direct the heat dissipated by the printed circuit boards to the walls of the module.

One major aim of the invention is therefore to overcome this drawback.

SUMMARY OF THE INVENTION

To achieve this aim, the invention proposes an electronic device comprising an electronic gear module configured to house one or more plug-in electronic subassemblies, each electronic subassembly comprising a printed circuit board supporting heat-dissipating electronic components, a heat sink, a first side of which is in contact with electronic components on a first side of the printed circuit board and a second side of which is designed to evacuate the heat by convection, The subassembly also comprises:

a cover joined to the heat sink and the printed circuit board, delimiting a channel between the second side of the heat sink and the cover, for a coolant to circulate to ensure convection, deformable seals ensuring the seal-tightness of the channel, said channel preventing the coolant from coming into contact with the electronic components.

Compared to the state of the art described above, the invention offers a three-fold advantage:

its heat dissipation effectiveness is reinforced;
its modularity helps to reduce the weight of the computers;
its compatibility with the known standards governing known aeronautical modules facilitates the design phases.

The cover of each electronic subassembly provides both a coolant channeling function for the electronic board that it comprises, and a function for isolating this flow from the components located on the second side of an electronic board of an adjacent electronic subassembly.

The heat exchange surface area with a coolant external to the module is directly linked to the integrated circuit board, as close as possible to the sources of heat that it is required to evacuate. The invention therefore makes it possible to avoid the use of a heat drain to evacuate the heat from the module, which is very favorable with regard to the thermal budget. This is all the more true when the number of integrated circuit boards fitted in the module is high, because the heat exchange surface area is proportional to the number of integrated circuit boards used. Also, the use of a heat drain covering all possible dissipation, since it can be heavy and/or bulky, is not always favorable in terms of the weight and volume budget. Such is the case, for example, when the module is equipped with a single integrated circuit board.

According to one characteristic of the invention, the electronic gear module is provided with openings enabling a coolant coming from outside the electronic gear module to circulate in the channel.

Advantageously, the device comprises means to ensure the seal-tightness of the channel relative to the useful interior space of the electronic gear module.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

FIG. 2b represents, in a cut-away perspective view, the internal structure of the cavity formed by the electronic gear module represented in FIG. 2a;

DETAILED DESCRIPTION OF THE INVENTION

To facilitate the reading of the description, the same references denote the same elements in the different figures.

Figure 1:
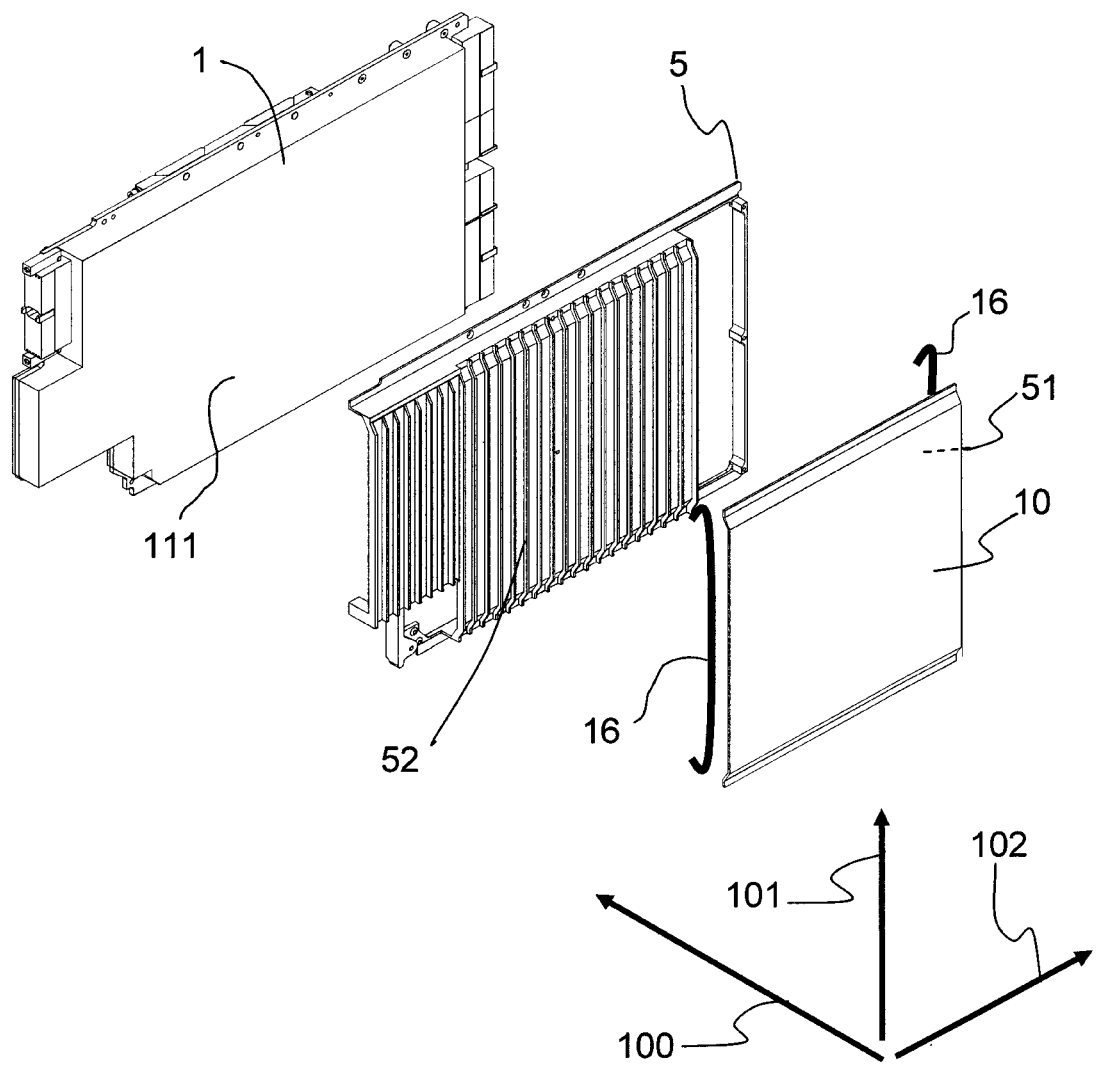
FIG. 1 represents an exploded view of an electronic subassembly of the inventive electronic device comprising a printed circuit board, a heat sink, a cover and deformable seals.

FIG. 1 represents, in an exploded view, an inventive electronic device comprising a printed circuit board 1, a heat sink 5, a cover 10 and deformable seals 16.

The printed circuit board 1 supports electronic components that dissipate heat when they are powered and operating. Preferably, the electronic components that dissipate the most heat are assembled on a first side 111 of the printed circuit board 1.

Advantageously, the heat sink 5 is roughly flat, parallel to the printed circuit board 1.

A first side 51 of the heat sink 5 is designed to be placed in contact with electronic components on the first side 111 of the printed circuit board 1, on a horizontal axis 100. A second side 52 of the heat sink 5 is designed to evacuate the heat by convection. The second side 52 comprises, for example, fins whose dimension in a vertical axis 101 corresponds to the vertical dimension of the board 1.

Advantageously, the cover 10 is roughly flat, parallel to the printed circuit board 1.

The cover 10 is designed to be applied against the heat sink 5, on the horizontal axis 100.

The deformable seals 16 are of linear form, and are fixed to the heat sink 5, or to the cover 10. They maintain a free space between the second side 52 of the heat sink 5 and the cover 10.

When the printed circuit board 1, the heat sink 5, the deformable seal 16, and the cover 10 are joined together on the axis 100 to form a joined assembly, they form an electronic subassembly 1000. In this case, the second side 52 of the heat sink 5 and the cover 10 delimit a seal-tight channel 4, represented more explicitly in FIG. 4, in which a coolant 20 can circulate along the vertical axis 101, to ensure convection of the heat dissipated by the heat sink 5.

The coolant 20 is, for example, blown air, possibly carrying corrosive impurities.

Figure 2A:
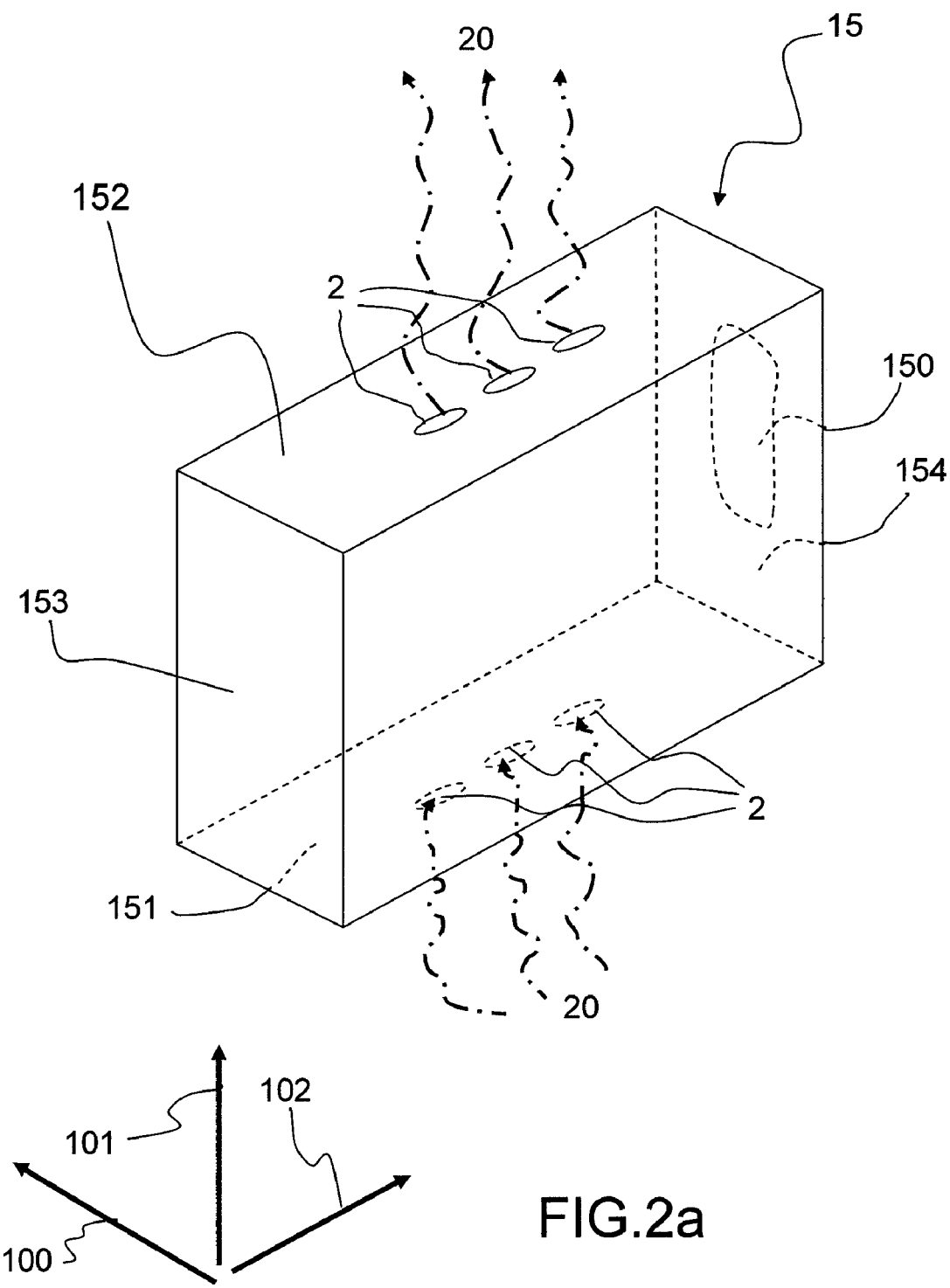
FIG. 2a represents, in a perspective view, an electronic gear module that can contain an electronic subassembly.

FIG. 2a represents, in a perspective view, an inventive electronic gear module 15. The horizontal axis 100 and the vertical axis 101 are common to FIGS. 2a and 2b.

The module 15 is metal, parallelepipedal in form and delimits an internal cavity. Horizontal sides 151, 152 of the module 15 comprise openings 2, which are leading orifices connecting the interior and the exterior of the module. One side 153 of the module 15 is removable, and can be temporarily removed to introduce into the cavity formed by the module 15 at least one electronic subassembly 1000 similar to that of FIG. 1, on a horizontal axis 102. One side 154 of the module 15 is equipped with at least one connector 150, intended to be connected with a complementary connector.

The complementary connector is mounted on a backplane of a subrack, to provide the electrical connections for the electronic gear of the module 15, with the external environment in which they are intended to operate.

A module equipped with such a connector 150 is "rackable" in that it can be placed with others in an electronic gear storage rack with standardized dimensions.

This type of module 15 is routinely used in aeronautics, for example to produce onboard computers. When the removable side 154 closes the module 15, the module 15 is seal-tight to the coolant 20 in which it is submerged, apart from the openings 2.

Advantageously, the electronic gear module 15 is pluggable and can be mounted, with others, removably on a subrack.

Figure 2B:
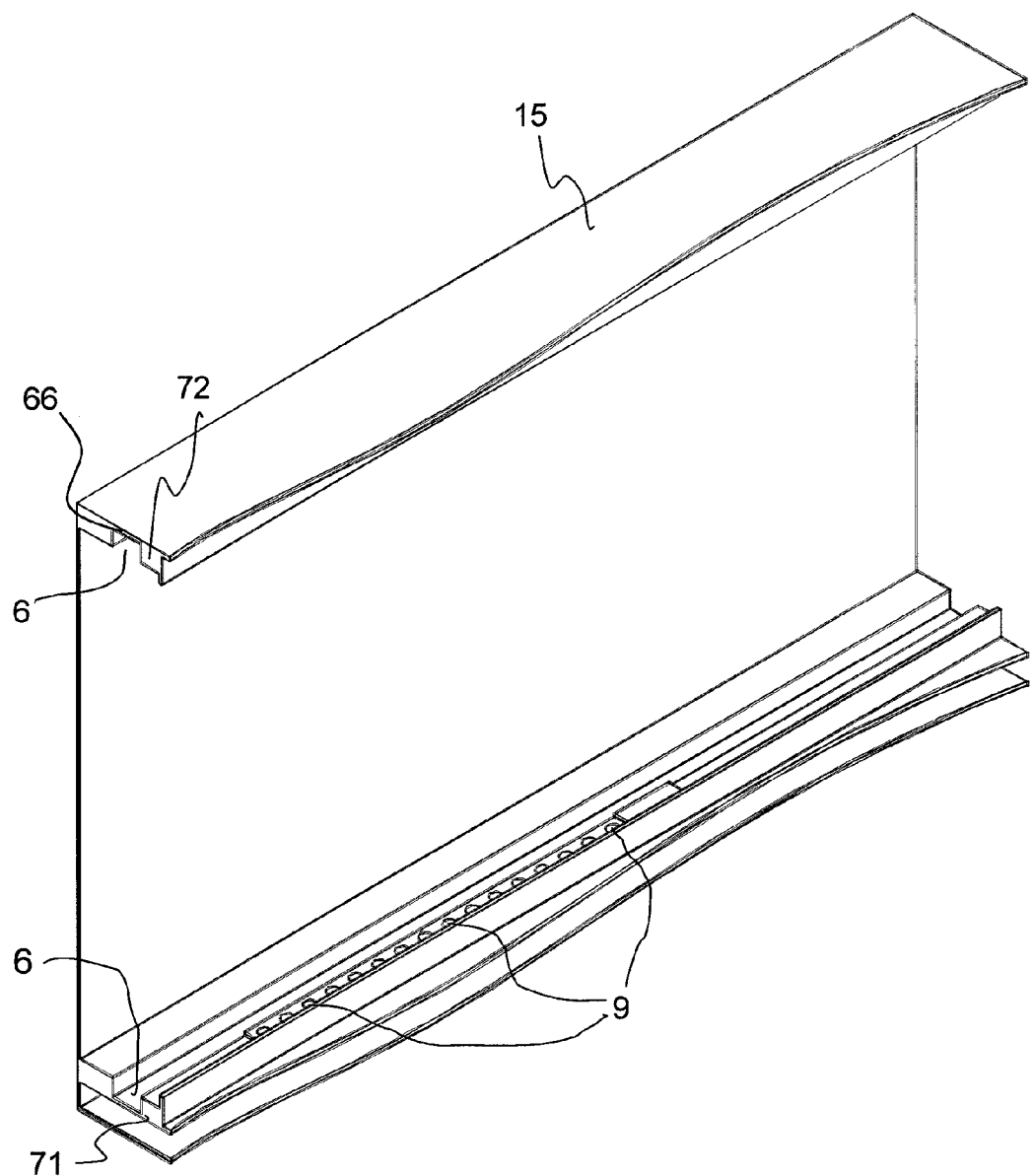

FIG. 2b represents a partial, cut-away perspective view of an inventive electronic gear module 15. The module 15 comprises, on internal walls of the horizontal sides 151, 152, a locking means and sliders 6. The locking means, not represented, is used to join the subassembly 1000 to the module 15. The sliders 6 are used to guide the electronic subassembly 1000 inside the module 15. The sliders 6 include leading orifices 9, connecting the interior space of the module 15 with fluid circulation filaments 71 and 72. The filaments 71, 72 are, themselves, connected to the outside of the module 15, through openings 2, placed on the surface of the module 15, and leading to the filaments 71, 72. The openings can be seen in FIG. 2a and are not represented in FIG. 2b. Apart from the leading orifices 9, and the openings 2, the filaments 71, 72 are seal-tight.

Figure 3:
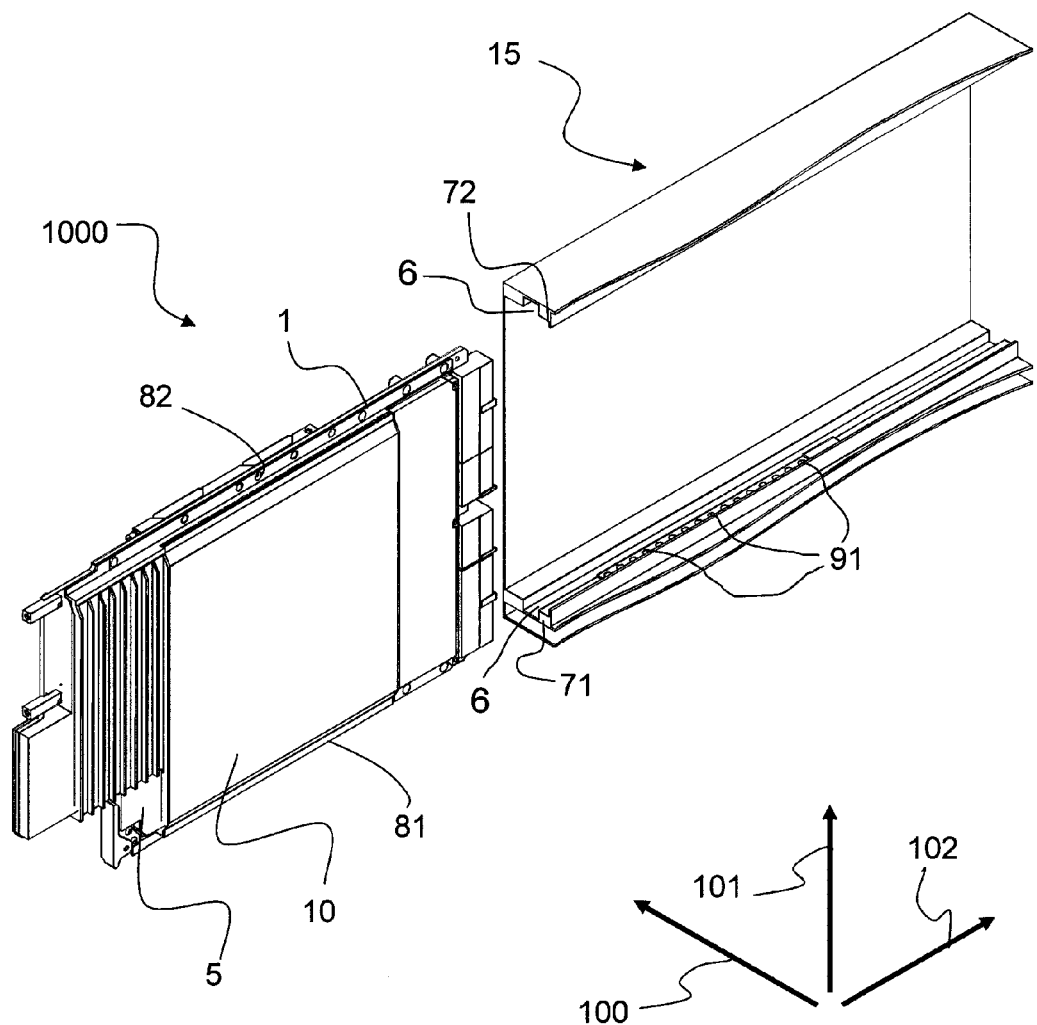
FIG. 3 represents, in a cut-away perspective view, an inventive electronic device comprising an electronic subassembly as represented in FIG. 1 and an electronic gear module as represented in FIG. 2b, and explains the means by which the electronic subassembly is housed in the module.

FIG. 3 represents, in a perspective view, an inventive electronic device comprising a subassembly 1000 identical to that represented in FIG. 1, and an electronic gear module 15 identical to that represented in FIG. 2b. The subassembly 1000 comprises a printed circuit board 1, a heat sink 5, deformable seals 16, not visible in FIG. 3, and a cover 10.

Figure 4:
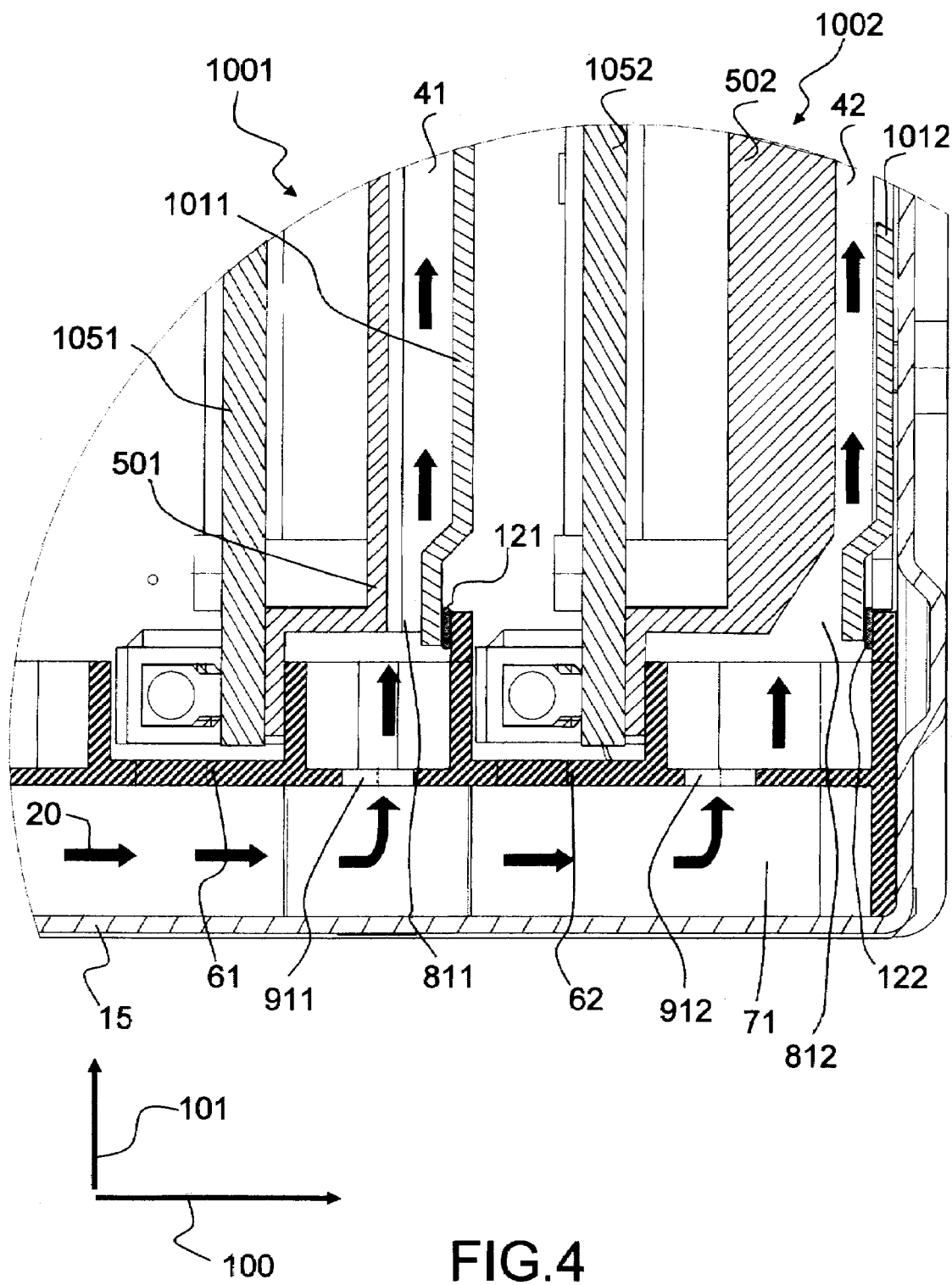
FIG. 4 represents, in cross section, a detail of the internal structure of an inventive electronic device.

The cover 10 and the second side 52 of the heat sink 5 delimit a sealed channel 4, visible in FIG. 4. The channel 4 has two ends 81, 82 located, in the representation of FIG. 3, respectively on the bottom and top parts of the subassembly 1000.

The module 15 is partially represented to show how the subassembly 1000 is housed in the module 15. The subassembly 1000, guided by the sliders 6, can, in the module 15, take a position, called locked position, in which a locking means joins it to the module 15. Once in the locked position, the electronic subassembly 1000 is fully inserted inside the module 15, which makes it possible to enclose the subassembly in the module 15 by replacing the side 153 of the module 15, to close it.

When the subassembly 1000, housed in the module 15, is in the locked position, the leading orifices 9, and the ends 81, 82 of the channel 4, are perfectly juxtaposed. Thus, a coolant 20, in which the exterior of the module 15, including all its sides, is submerged, can enter into the module 15, exclusively through the openings 2. Said coolant then follows the circulation filaments 71, 72, to reach the leading orifices 9, enter into the channel 4, and lick the second side 52 of the heat sink 5, avoiding any contact with the electronic components carried by the printed circuit board 1.

FIG. 4 represents a detail of the contact between the electronic subassemblies 1001, 1002, similar to those of FIG. 1, and a module 15, similar to that of FIG. 2b, in a partial view, in cross section on a plane orthogonal to that of the printed circuit boards of the subassemblies, or even along the plane formed by 100 and 101.

These two electronic subassemblies 1001, 1002 are placed in the locked position, parallel to one another, in the module 15. Each of the subassemblies 1001, 1002 is guided by a slider 61, 62 and joined to the module 15, by a locking means which is not represented. Each subassembly 1001, 1002 comprises a printed circuit board 1051, 1052, a heat sink 501, 502, deformable seals which are not represented in this figure, identical to those represented in FIG. 1, and a cover 1011, 1012. For each electronic subassembly 1001, 1002, a seal-tight channel 41, 42 is formed between the heat sink 501, 502 and the cover 1011, 1012 that comprise it.

One end 811, 812 of the channel forms an inlet for a coolant 20, coming from outside the module 15, and another end, 821, 822, not represented, forms an outlet for the coolant 20. The ends 811 and 812 lead to orifices 9, placed on a wall of a fluid circulation filament 71, internal to the module 15. The wall of the filament 71 also comprises openings 2, which are leading orifices to the outside of the module 15, and which are not represented in this figure. The number and the size of the leading orifices 9 are suited to each channel 41, 42 to correspond to the convection dissipation requirement of the corresponding heat sink 51, 52. The number and the size of the openings 2 are adapted to correspond to the overall convection dissipation requirement of the heat sinks of the electronic subassemblies enclosed in the module 15.

The connection between the channel 41, 42 and the fluid circulation filaments 71, 72 is seal-tight. The seal-tightness is provided on the one hand by the locking means, and on the other hand by seal-tight deformable seals 121 and 122 placed between the electronic subassembly and the internal structure of the module 15.

A coolant 20, external to the module 15, penetrates into the module 15 through the openings 2, placed on a common wall of the module 15 and the filament 71. It is transported by the filament 71 to leading orifices 9, which give access to the end 811, 812 of the seal-tight channel 41, 42. The coolant 20 then passes through the seal-tight channel 41, 42 to reach the other end 821, 822, not represented, of the channel 41, 42 through the leading orifices 921, 922, also not represented, which give access to the filament 72, again not represented. The coolant 20 finally passes through the filament 72 and leaves the module 15 through the openings 2, placed on a common wall of the module 15 and the filament 72.

Figure 5:
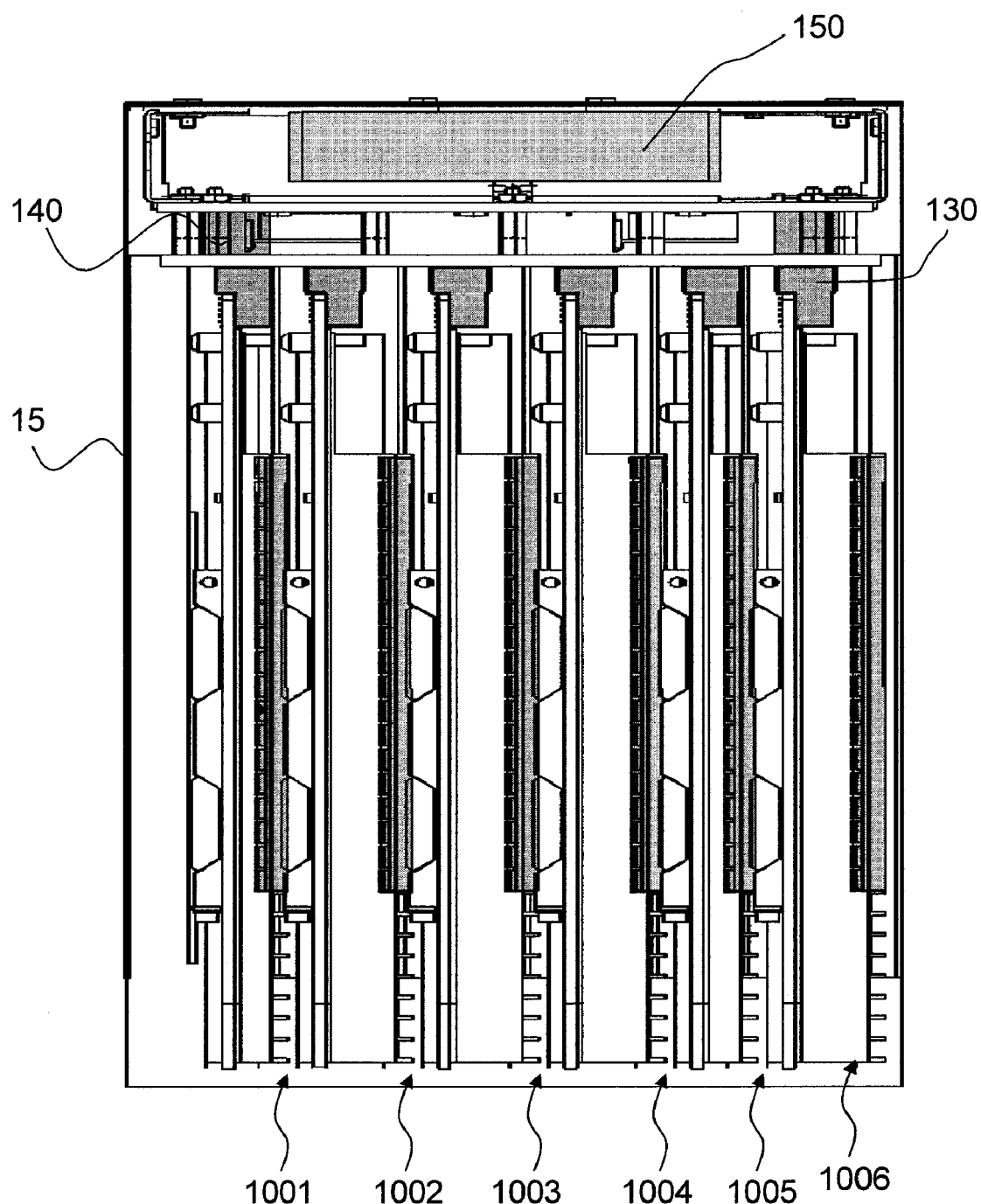
FIG. 5 represents, in cross section, an inventive electronic device comprising an electronic gear module and several electronic subassemblies.
Figure 5:
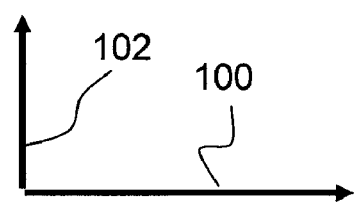

FIG. 5 represents an inventive electronic device comprising an electronic gear module 15 and six electronic subassemblies 1001, 1002, 1003, 1004, 1005, 1006, similar to those of FIG. 1, housed in the module 15, in their locked position, in a cross-sectional view on a plane orthogonal to the printed circuit boards of the subassemblies, or even on the plane formed by 100 and 102.

The module 15 comprises internal connectors 130, into which are plugged electronic subassemblies 1000. The internal connectors 130 are carried by an interconnection module 140 comprising electronic contacts, each contact comprising two ends. One end of the contacts is connected to the connector 150 of the module 15. The other end of the contacts is connected to the contacts of the printed circuit board.

In other words, the printed circuit board 1 plugs into the electronic gear module 15.

Advantageously, the electronic gear module 15 and the printed circuit board 1 housed in the electronic gear module 15 conform to a specification from the following list: ARINC 600, MIL 83 527, ARINC 404A.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by the definition contained in the appended claims and equivalent thereof.

The invention claimed is:

1. An electronic device comprising:
    an electronic gear module configured to house one or more plug-in electronic subassemblies, each electronic subassembly comprising a joined assembly which includes
        a printed circuit board supporting heat-dissipating electronic components,
        a heat sink, a first side of which is in contact with electronic components on a first side of the printed circuit board and a second side of which is designed to evacuate heat by convection, and
        a cover applied against the second side of the heat sink with deformable seals in between for maintaining a free space between said second side of the heat sink and the cover, said delimited free space of the joined assembly between the second side of the heat sink and the cover forming a channel for a coolant to circulate to ensure convection,
        wherein the deformable seals ensure a seal-tightness of the channel, and said channel prevents the coolant from coming into contact with the electronic components.

2. The device as claimed in claim 1, wherein said electronic gear module, in which the electronic subassembly or subassemblies is/are housed, is provided with openings enabling a coolant coming from outside said module to circulate in each said channel.

3. The device as claimed in claim 1, wherein the heat sink of each said electronic subassembly is roughly flat, parallel to the printed circuit board.

4. The device as claimed in claim 1, wherein the cover of each said electronic subassembly is roughly flat, parallel to the printed circuit board.

5. The device as claimed in claim 1, further comprising means for ensuring the seal-tightness of each said channel relative to an interior space of the electronic gear module.

6. The device as claimed in claim 1, wherein the electronic gear module and the printed circuit board or boards conform to a specification from the following list: ARINC 600, MIL 83 527, ARINC 404A.

7. The device as claimed in claim 2, wherein the electronic gear module and the printed circuit board or boards conform to a specification from the following list: ARINC 600, MIL 83 527, ARINC 404A.

8. The device as claimed in claim 2, wherein the electronic gear module and the printed circuit board or boards conform to a specification from the following list: ARINC 600, MIL 83 527, ARINC 404A.

9. The device as claimed in claim 4, wherein the electronic gear module and the printed circuit board or boards conform to a specification from the following list: ARINC 600, MIL 83 527, ARINC 404A.

10. The device as claimed in claim 5, wherein the electronic gear module and the printed circuit board or boards conform to a specification from the following list: ARINC 600, MIL 83 527, ARINC 404A.

11. The device as claimed in claim 2, wherein the heat sink of each said electronic subassembly is roughly flat, parallel to the printed circuit board.

12. The device as claimed in claim 11, wherein the cover of each said electronic subassembly is roughly flat, parallel to the printed circuit board.

13. The device as claimed in claim 12, further comprising means for ensuring the seal-tightness of each said channel relative to an interior space of the electronic gear module.

14. The device as claimed in claim 13, wherein the electronic gear module and the printed circuit board or boards conform to a specification from the following list: ARINC 600, MIL 83 527, ARINC 404A.

* * * * *